United States Patent
Cho et al.

(10) Patent No.: US 8,493,114 B2
(45) Date of Patent: Jul. 23, 2013

(54) TEMPERATURE COMPENSATION CIRCUIT AND SYNTHESIZER USING THE TEMPERATURE COMPENSATION CIRCUIT

(75) Inventors: Lan-Chou Cho, New Taipei (TW); Augusto Marques, Moscavide (PT)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 133 days.

(21) Appl. No.: 13/292,087

(22) Filed: Nov. 9, 2011

(65) Prior Publication Data
US 2013/0009680 A1  Jan. 10, 2013

Related U.S. Application Data

(60) Provisional application No. 61/504,762, filed on Jul. 6, 2011.

(51) Int. Cl.
*H03L 7/06* (2006.01)
(52) U.S. Cl.
USPC ............ 327/156; 327/147; 327/512; 327/513
(58) Field of Classification Search
USPC .................................. 327/147, 156, 512, 513
See application file for complete search history.

(56) References Cited

U.S. PATENT DOCUMENTS

| | | | |
|---|---|---|---|
| 4,717,891 A * | 1/1988 | Ichise et al. ...................... 331/17 |
| 7,161,440 B2 * | 1/2007 | Meltzer ............................ 331/76 |
| 7,164,325 B2 | 1/2007 | Aparin | |
| 7,701,301 B2 * | 4/2010 | Lakshmikumar et al. ....... 331/57 |
| 8,140,040 B1 * | 3/2012 | Leon ............................... 455/260 |
| 8,175,199 B2 * | 5/2012 | Nakatani ........................ 375/344 |
| 2005/0128018 A1 * | 6/2005 | Meltzer .......................... 331/176 |
| 2007/0126485 A1 * | 6/2007 | Tateyama et al. .............. 327/156 |
| 2009/0310712 A1 * | 12/2009 | Nakatani ........................ 375/316 |
| 2010/0123490 A1 * | 5/2010 | Marton et al. .................. 327/156 |
| 2010/0141347 A1 * | 6/2010 | Hsiao et al. ..................... 331/17 |
| 2010/0225402 A1 * | 9/2010 | Yang et al. ...................... 331/10 |
| 2010/0301910 A1 * | 12/2010 | Hu et al. ......................... 327/156 |
| 2011/0128080 A1 * | 6/2011 | Wennekers et al. ............. 331/34 |
| 2011/0273333 A1 * | 11/2011 | Terasawa et al. ........... 342/357.77 |
| 2011/0316595 A1 * | 12/2011 | Bolton ............................ 327/156 |
| 2012/0139594 A1 * | 6/2012 | Leon ............................... 327/156 |
| 2012/0223771 A1 * | 9/2012 | Zhang ............................. 327/586 |
| 2012/0249249 A1 * | 10/2012 | Shen ................................ 331/16 |
| 2012/0286890 A1 * | 11/2012 | Terasawa ........................ 331/176 |
| 2013/0009680 A1 * | 1/2013 | Cho et al. ....................... 327/156 |

OTHER PUBLICATIONS

[Yue Wu and Vladimir Aparin], [2005 Symposium on VLSI Circuits Digest of Technical Papers], [A Temperature Stabilized CMOS VCO for Zero-IF Cellular CDMA Receivers], [2005], [398-401], [25-2].

* cited by examiner

*Primary Examiner* — Adam Houston
(74) *Attorney, Agent, or Firm* — Winston Hsu; Scott Margo

(57) ABSTRACT

A temperature compensation circuit includes: a sensing circuit arranged to sense a temperature to generate a sensing signal; an operational circuit arranged to sample the sensing signal to generate a sample signal during a first phase, and arranged to generate an output signal according to the sensing signal and the sample signal during a second phase; and a capacitive circuit arranged to provide a capacitance adjusted by the output signal.

19 Claims, 5 Drawing Sheets

TEMPERATURE COMPENSATION CIRCUIT AND SYNTHESIZER USING THE TEMPERATURE COMPENSATION CIRCUIT

CROSS REFERENCE TO RELATED APPLICATIONS

This application claims the benefit of U.S. Provisional Application No. 61/504,762, which was filed on 2011 Jul. 6 and is included herein by reference.

BACKGROUND

The present invention relates to a temperature compensation circuit and a synthesizer using the temperature compensation circuit, and more particularly to a temperature compensation circuit capable of adjusting a capacitance according to ambient temperature and a related synthesizer.

In a voltage-controlled oscillator (VCO), the oscillating output signal is controlled by a control voltage, wherein the control voltage is inputted to a voltage-controlled capacitor in the VCO to control the capacitance of the voltage-controlled capacitor. However, the voltage-controlled capacitor, inductor and some parasitic capacitor of VCO may further be affected by temperature. In other words, when the control voltage of the VCO is invariant but the ambient temperature is variant, the oscillating frequency of the oscillating output signal may also be varied by the ambient temperature. When the VCO is applied in a phase-locked loop circuit of a wireless communication system, the imperfect temperature immunity of the VCO may seriously affect the locking performance of the phase-locked loop circuit. Therefore, providing a mechanism to compensate the frequency drifting due to the variation of the voltage-controlled capacitor and inductor in the VCO is a significant concern in this field.

SUMMARY

One of the objectives of the present embodiment is to provide to a temperature compensation circuit capable of adjusting a capacitance according to ambient temperature, and a related synthesizer.

According to a first embodiment of the present invention, a temperature compensation circuit is provided. The temperature compensation circuit comprises a sensing circuit, an operational circuit, and a capacitive circuit. The sensing circuit is arranged to sense a temperature to generate a sensing signal. The operational circuit is arranged to sample the sensing signal to generate a sample signal during a first phase, and arranged to generate an output signal according to the sensing signal and the sample signal during a second phase. The capacitive circuit is arranged to provide a capacitance adjusted by the output signal.

According to a second embodiment of the present invention, a synthesizer is provided. The synthesizer comprises a phase-locked loop circuit, a capacitive circuit, and a temperature compensation circuit. The phase-locked loop circuit at least has a controllable oscillator controlled by a first control signal and a second control signal, wherein the first control signal is derived from an output oscillating signal of the synthesizer and a reference oscillating signal. The capacitive circuit is arranged to provide a capacitance for the controllable oscillator according to the second control signal. The temperature compensation circuit comprises a sensing circuit and an operational circuit. The sensing circuit is arranged to sense a temperature to generate a sensing signal. The operational circuit is arranged to sample the sensing signal to generate a sample signal during a first phase, and arranged to generate the second control signal according to the sensing signal and the sample signal during a second phase.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
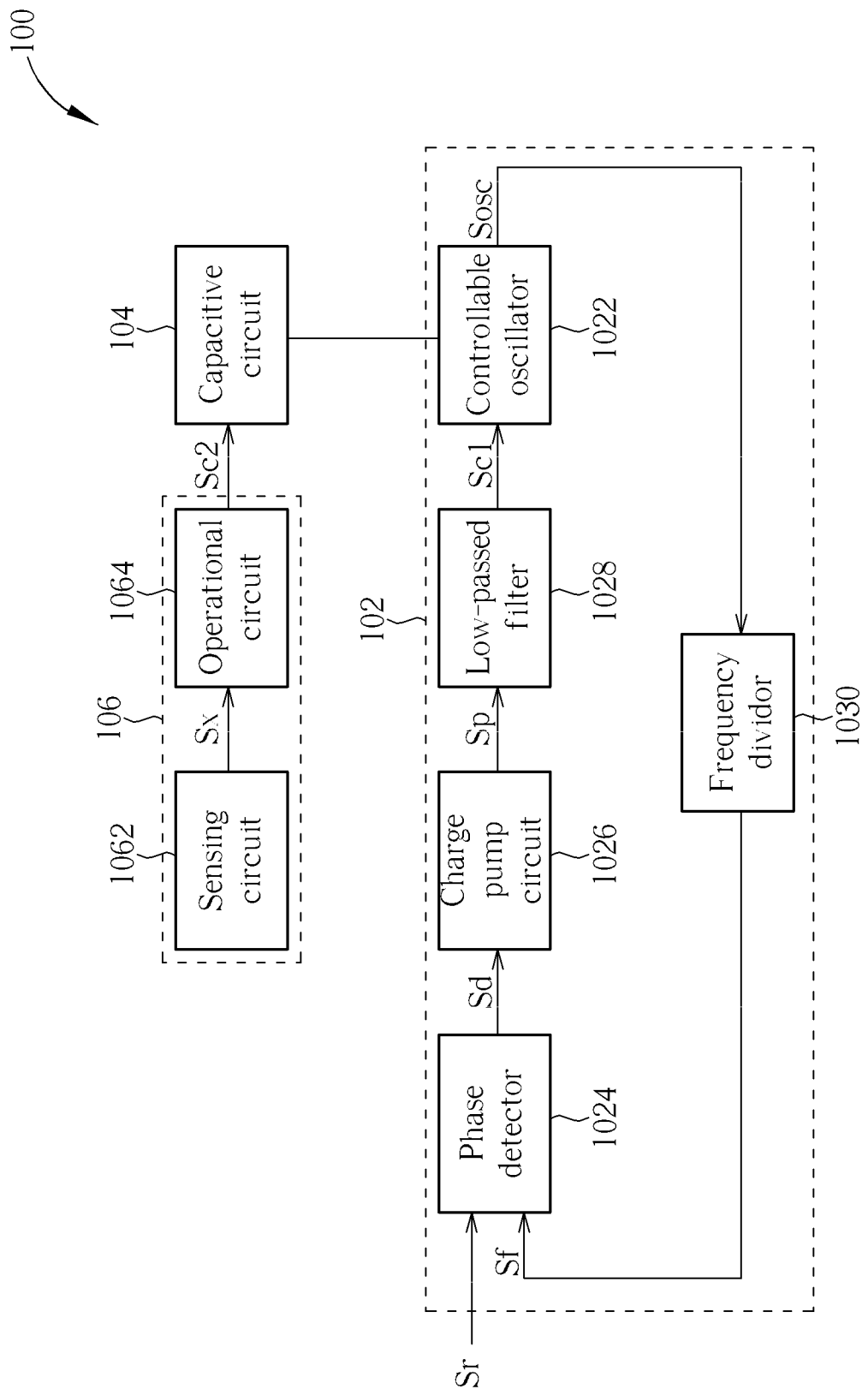
FIG. 1 is a diagram illustrating a synthesizer according to an embodiment of the present invention.

Please refer to FIG. 1. FIG. 1 is a diagram illustrating a synthesizer 100 according to an embodiment of the present invention. The synthesizer 100 comprises a phase-locked loop circuit 102, a capacitive circuit 104, and a temperature controlled circuit 106. The phase-locked loop circuit 102 at least has a controllable oscillator 1022 controlled by a first control signal Sc1 and a second control signal Sc2, wherein the first control signal Sc1 is derived from an output oscillating signal Sosc of the synthesizer 100 and a reference oscillating signal Sr. More specifically, the phase-locked loop circuit 102 may further comprise a phase detector 1024, a charge pump circuit 1026, a low-passed filter 1028, and a frequency divider 1030, wherein the arrangement of the controllable oscillator 1022, the phase detector 1024, the charge pump circuit 1026, the low-passed filter 1028, and the frequency divider 1030 are shown in FIG. 1. The phase detector 1024 is arranged to detect the phase difference between the reference oscillating signal Sr and a feedback signal Sf to generate a detected output signal Sd. The charge pump circuit 1026 is arranged to generate a charge pump signal Sp according to the detected output signal Sd. The low-passed filter 1028 is arranged to perform a low-passed filtering upon the detected output signal Sd to generate the first control signal Sc1. The capacitive circuit 104 is arranged to provide a capacitance for the controllable oscillator 1022 according to the second control signal Sc2. In other words, in this preferred embodiment, the capacitive circuit 104 may be the voltage-controlled capacitor, and the capacitance of the capacitive circuit 104 is controlled by the second control signal Sc2. Therefore, the controllable oscillator 1022 generates the output oscillating signal Sosc according to the first control signal Sc1 and the second control signal Sc2. The frequency divider 1030 performs a frequency dividing operation upon the output oscillating signal Sosc to generate the feedback signal Sf.

The temperature controlled circuit 106 comprises a sensing circuit 1062 and an operational circuit 1064. The sensing circuit 1062 is arranged to sense a temperature to generate a sensing signal Sx. The operational circuit 1064 is arranged to sample the sensing signal Sx to generate a sample signal Ss during a first phase, and arranged to generate the second control signal Sc2 according to the sensing signal Sx and the sample signal Ss during a second phase. In this preferred embodiment, the first phase may be a sample mode of the temperature controlled circuit 106 and the second phase may be a comparing mode of the temperature controlled circuit 106.

Figure 2:
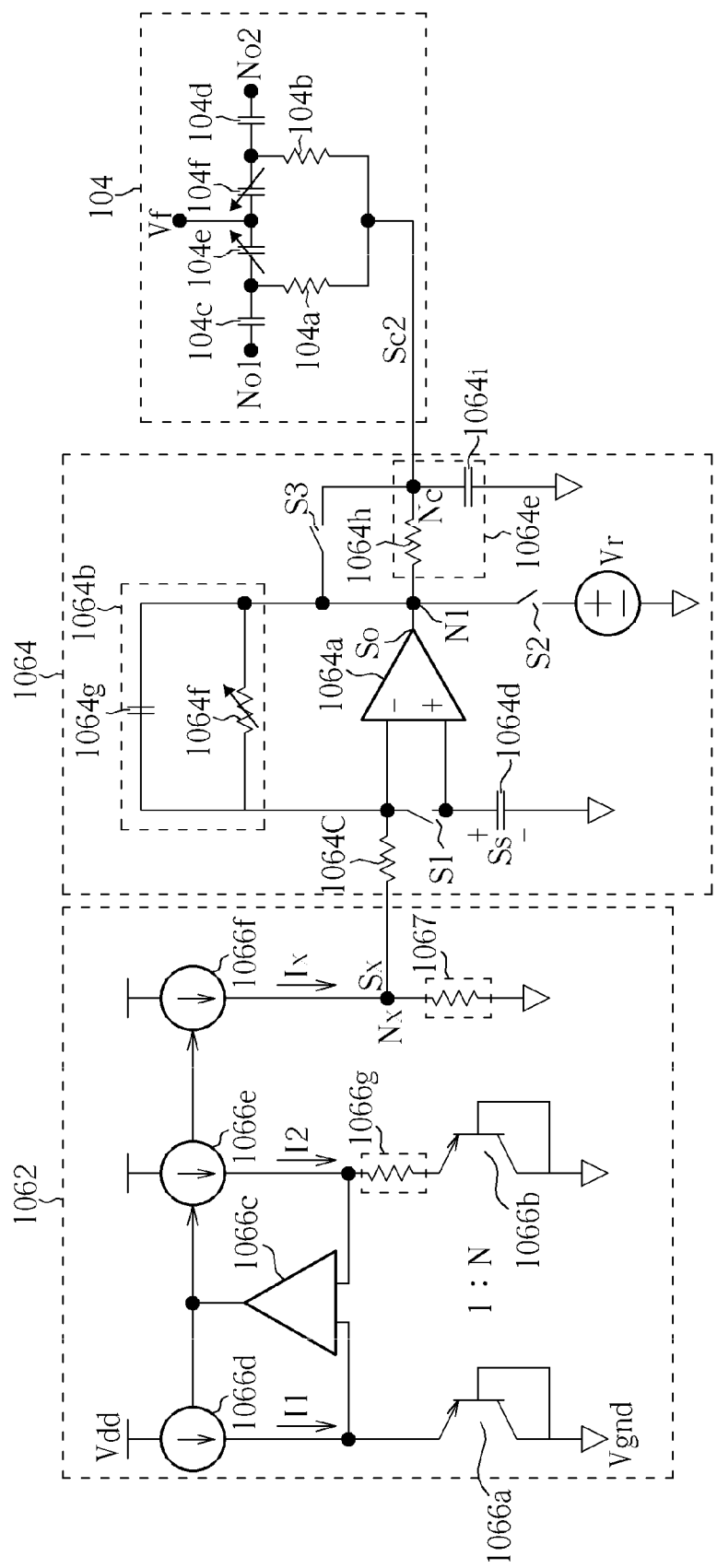
FIG. 2 is a diagram illustrating a sensing circuit, an operational circuit, and a capacitive circuit according to an embodiment of the present invention.

Please refer to FIG. 2. FIG. 2 is a diagram illustrating the detailed circuits of the sensing circuit 1062, the operational circuit 1064, and the capacitive circuit 104 according to an embodiment of the present invention. The sensing circuit 1062 comprises a temperature-controlled current source 1066 and a resistor 1067, wherein the temperature-controlled current source 1066 provides a sensing current Ix to the resistor 1067. When the sensing current Ix flows through the resistor 1067, a sensing voltage (i.e., the sensing signal Sx) is generated at the connecting terminal Nx of the temperature-controlled current source 1066 and the resistor 1067. The temperature-controlled current source 1066 comprises a first bipolar junction transistor 1066a, a second bipolar junction transistor 1066b, an amplifier 1066c, a first current source 1066d, a second current source 1066e, a third current source 1066f, and a resistor 1066g. The bases of the first and second bipolar junction transistors 1066a, 1066b are connected to the collectors of the first and second bipolar junction transistors 1066a, 1066b respectively, and the collectors of the first and second bipolar junction transistors 1066a, 1066b are connected to the ground voltage Vgnd. The emitters of the first and second bipolar junction transistors 1066a, 1066b are connected to the first and second input terminals of the amplifier 1066c respectively. The first current source 1066d provides a current I1 from the supply voltage Vdd to the emitter of the first bipolar junction transistor 1066a, and the second current source 1066e provides a current I2 to the emitter of the second bipolar junction transistor 1066b. The third current source 1066f generates the sensing current Ix according to the current I2. Furthermore, the resistor 1066g is between the second current source 1066e and the emitter of the second bipolar junction transistor 1066b as shown in FIG. 2. It should be noted that, in this preferred embodiment, the first current source 1066d, the second current source 1066e, and the third current source 1066f are configured as a current mirroring circuit, wherein the third current source 1066f mirrors the current I2 to generate the sensing current Ix. According to the arrangement of the sensing circuit 1062, the sensing voltage (i.e., the sensing signal Sx) may be changed according to the ambient temperature due to the negative temperature dependence of the base-emitter junction voltage of the second bipolar junction transistor 1066b and the positive temperature dependence of the resistance of the resistor 1066g. Therefore, the current I2 and the sensing current Ix may be the negative temperature dependent values, and consequently the voltage of the sensing signal Sx may be the positive temperature dependent value.

The operational circuit 1064 comprises an operational amplifier 1064a, a feedback circuit 1064b, a first resistor 1064c, a first capacitor 1064d, and a filtering circuit 1064e. The feedback circuit 1064b is coupled between a first input terminal (i.e., the negative input terminal "−") and an output terminal N1 of the operational amplifier 1064a, wherein the first input terminal is arranged to receive the sensing signal Sx and the output terminal N1 is arranged to output an output signal So. The first resistor 1064c is coupled between the negative input terminal "−" of the operational amplifier 1064a and the connecting terminal Nx of the sensing circuit 1062. The first capacitor 1064d is coupled to a second input terminal (i.e., the negative input terminal "+") of the operational amplifier 1064a. The filtering circuit 1064e is coupled between the output terminal N1 of the operational amplifier 1064a and a control terminal Nc of the capacitive circuit 104, wherein the filtering circuit is arranged to perform a filter operation upon the output signal So to generate a filtered output signal (i.e., the second control signal Sc2) at the control terminal Nc for controlling the capacitive circuit 104 during the second phase of the temperature controlled circuit 106.

It should be noted that, during the first phase, the first capacitor 1064d is arranged to be coupled to the first and second input terminals (i.e., the negative and positive input terminals "−", "+") of the operational amplifier 1064a, and the output terminal N1 of the operational amplifier 1064a is arranged to couple to a predetermined voltage Vr. During the first phase, the first capacitor 1064d is not coupled to the first input terminal (i.e., the negative input terminal "−") of the operational amplifier 1064a, and the output terminal N1 of the operational amplifier 1064a is not coupled to the predetermined voltage Vr. Therefore, in this preferred embodiment, a first switch S1 is further included to selectively couple the negative input terminal "−" to the positive input terminal "+", and a second switch S2 is further included to selectively couple the output terminal N1 to the predetermined voltage Vr.

In addition, the feedback circuit 1064b comprises a second resistor 1064f and a second capacitor 1064g, wherein the second resistor 1064f is an adjustable resistor. The second resistor 1064f is coupled between the negative input terminal "−" and the output terminal N1 of the operational amplifier 1064a. The second capacitor 1064g is coupled between the negative input terminal "−" and the output terminal of the operational amplifier 1064a.

The filtering circuit 1064e comprises a second resistor 1064h and a second capacitor 1064i. The second resistor 1064h is coupled between the output terminal N1 of the operational amplifier 1064a and the control terminal Nc of the capacitive circuit 104. The second capacitor 1064i is coupled to the control terminal Nc and the ground voltage Vgnd, wherein the output terminal So is arranged to directly couple the control terminal Nc during the first phase. Therefore, in this preferred embodiment, a third switch S3 is further included to selectively couple between the output terminal So to the control terminal Nc.

Furthermore, the capacitive circuit 104 comprises a first resistor 104a, a second resistor 104b, a first capacitor 104c, a second capacitor 104d, a first voltage controlled capacitor 104e, and a second voltage controlled capacitor 104f. The first terminals of the first resistor 104a and the second resistor 104b are coupled to the control terminal Nc for receiving the second control signal Sc2. The first voltage controlled capacitor 104e has a first terminal coupled to a fixed voltage Vf and a second terminal coupled to the second terminal of the first resistor 104a. It should be noted that the fixed voltage Vf is not the tuning voltage (e.g., the first control signal Sc1) generated by the low-passed filter 1028. The second voltage controlled capacitor 104f has a first terminal coupled to the fixed voltage Vf and a second terminal coupled to the second terminal of the second resistor 104b.

It is noted that the first voltage controlled capacitor 104e and the second voltage controlled capacitor 104f may be implemented by the varactors. The first capacitor 104c has a first terminal coupled to a first output terminal No1 of the controllable oscillator 1022 and a second terminal coupled to the second terminal of the first resistor 104a. The second capacitor 104d has a first terminal coupled to a second output terminal No1 of the controllable oscillator 1022 and a second terminal coupled to the second terminal of the second resistor 104b. It should be noted that the first output terminal No1 and the second output terminal No2 may be configured as the differential output terminals of the controllable oscillator 1022, wherein the differential output terminals are used to output the output oscillating signal Sosc.

When the synthesizer 100 is operating, the sensing circuit 1062 generates the sensing signal Sx according to the temperature, wherein the voltage level Vx of the sensing signal Sx can be expressed by the following equation (1):

$$Vx = \frac{k \cdot T}{q} \cdot \frac{R2 \cdot \ln(N)}{R1}, \qquad (1)$$

wherein k is Boltzmann's constant, T is the absolute temperature, q is the charge of an electron, R1 is the resistance of the resistor 1066g, R2 is the resistance of the resistor 1067, and N is an integer represented the ratio between the junction areas of the first bipolar junction transistor 1066a and the second bipolar junction transistor 1066b as shown in FIG. 2.

When the operational circuit 1064 needs to sample the sensing signal Sx, the first switch S1 is controlled to couple the negative input terminal "−" to the positive input terminal "+", and the second switch S2 is controlled to couple the output terminal N1 to the predetermined voltage Vr. Accordingly, the first capacitor 1064d and the second capacitor 1064g are charged by the sensing signal Sx and the predetermined voltage Vr during the sample mode. Therefore, the information of the temperature can be represented by the charge (i.e., the sample signal Ss) stored by the first capacitor 1064d.

Figure 3:
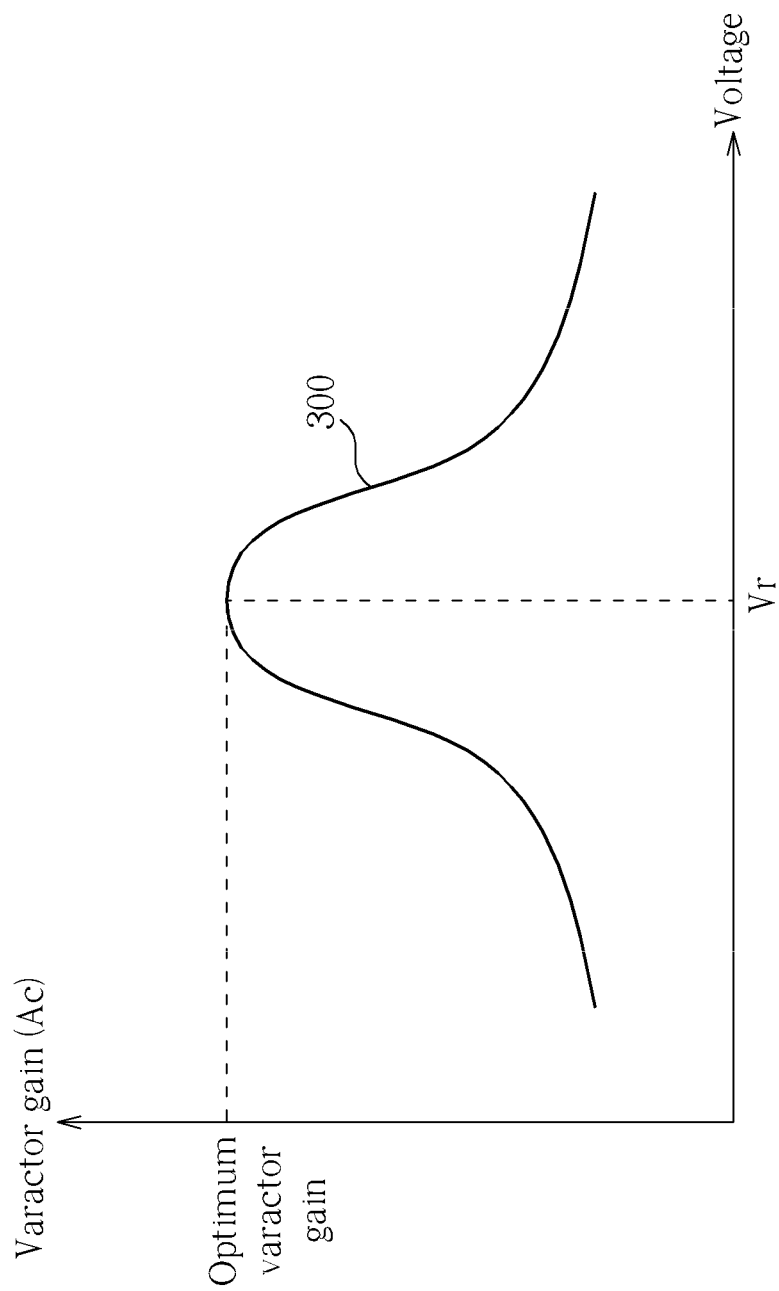
FIG. 3 is a diagram illustrating a relationship of a varactor gain of a capacitive circuit and a voltage level at a control terminal of the capacitive circuit.

On the other hand, when the temperature controlled circuit 106 operates in the sample mode, the predetermined voltage Vr is directly coupled to the control terminal Nc via the third switch S3. Therefore, the capacitance of the capacitive circuit 104 is determined by a predetermined voltage drop between the fixed voltage Vf and the predetermined voltage Vr during the sample mode. In other words, the varactor gain (i.e., the difference of capacitance over the voltage drop) of the capacitive circuit 104 can be set to an optimum value, i.e., the maximum capacitance gain, during the sample mode. It is noted that, for the synthesizer 100, the varactor gain is also referred to the difference of oscillating frequency of the output oscillating signal Sosc over the voltage drop since the difference of capacitance is corresponded to the difference of oscillating frequency of the output oscillating signal Sosc. FIG. 3 is a diagram illustrating the relationship of the varactor gain Ac of the capacitive circuit 104 and the voltage level at the control terminal Nc. It should be noted that the curve 300 also represents the relationship of the varactor gain of the first voltage controlled capacitor 104e (or the second voltage controlled capacitor 104f) and the voltage drop of the first voltage controlled capacitor 104e (or the second voltage controlled capacitor 104f). More specifically, when the capacitive circuit 104 operates under the optimum varactor gain, its varactor gain has the maximum value and the variation around the optimum varactor gain is relatively smaller than the other varactor gain.

Figure 4:
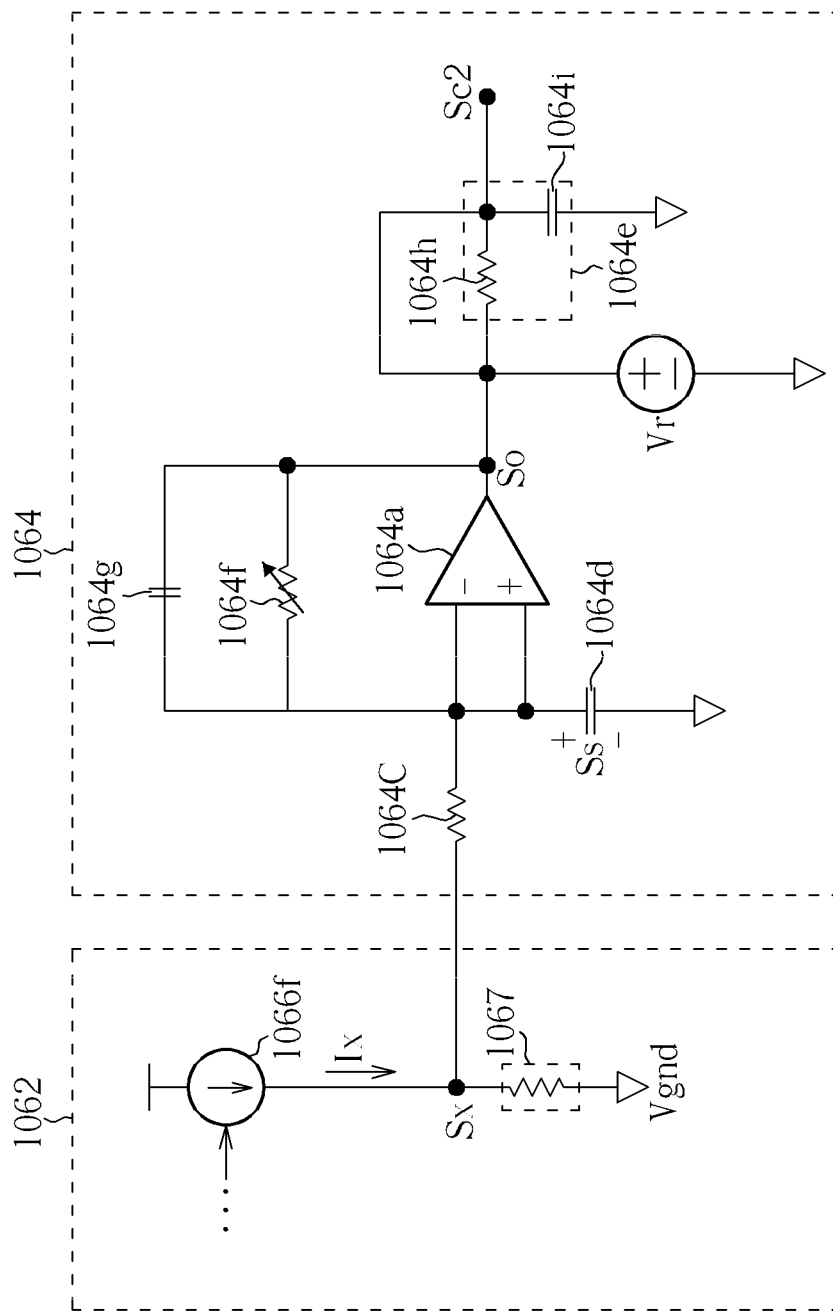
FIG. 4 is a diagram illustrating a sensing circuit and an operational circuit during a sample mode according to an embodiment of the present invention.

Please refer to FIG. 4. FIG. 4 is a diagram illustrating the sensing circuit 1062 and the operational circuit 1064 during the sample mode according to an embodiment of the present invention. Accordingly, the voltage level Vx of the sensing signal Sx can be expressed by the following equation (2):

$$Vx = Ix \cdot [R2 \mathbin{/\mkern-5mu/} (R3 + R4)] = 0.95 \cdot \frac{R2}{R1} \cdot \frac{k \cdot \ln(N)}{q} \cdot T, \qquad (2)$$

wherein R3 is the resistance of the first resistor 1064c, R2 is the resistance of the second resistor 1064f, R4=4*R3, and R3=4*R2.

Figure 5:
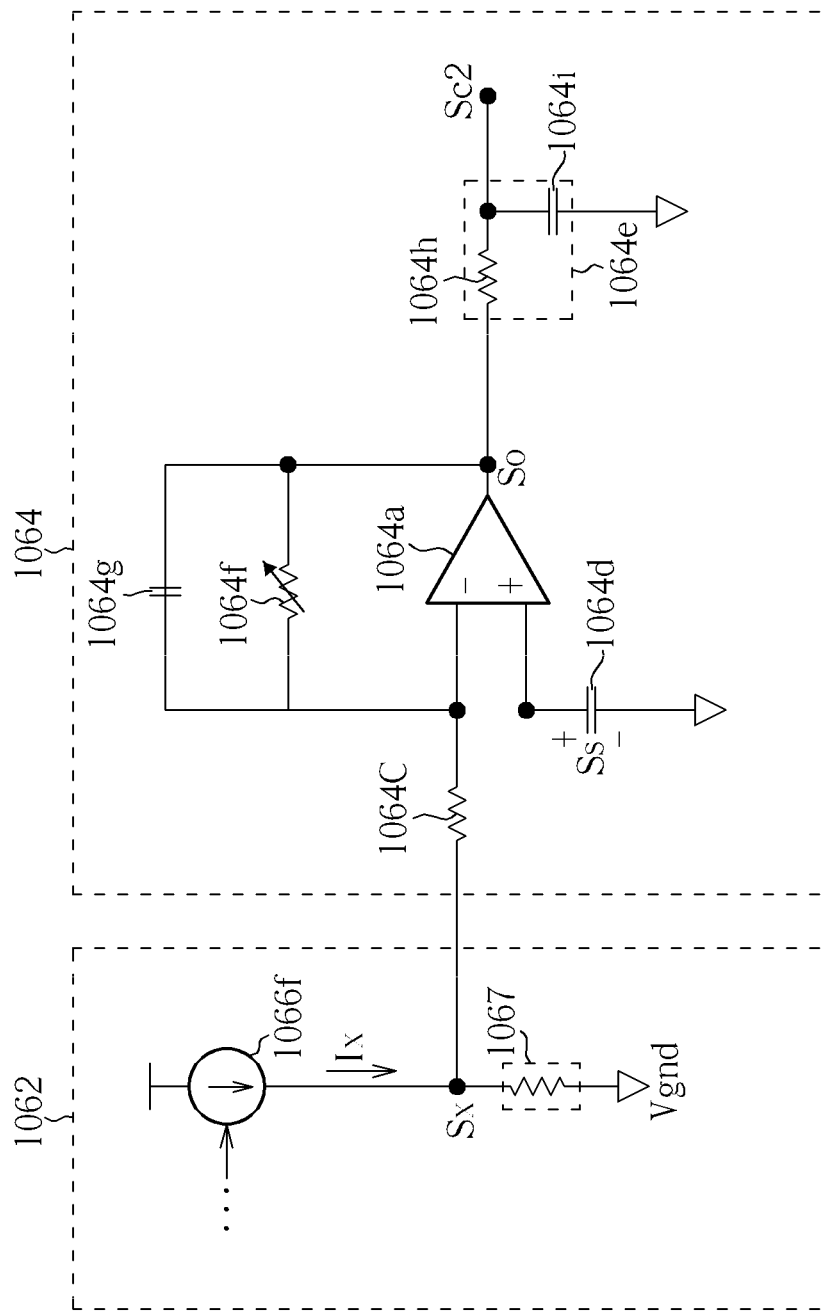
FIG. 5 is a diagram illustrating a sensing circuit and an operational circuit during a compared mode according to an embodiment of the present invention.

Then, when the temperature controlled circuit 106 operates in the compared mode, the voltage level Vx of the sensing signal Sx on the first capacitor 1064d is provided to the positive input terminal "+" of the operational amplifier 1064a, and the voltage level of the output signal So substantially equals the predetermined voltage Vr if the temperature remains unchanged. Please refer to FIG. 5. FIG. 5 is a diagram illustrating the sensing circuit 1062 and the operational circuit 1064 during the compared mode according to an embodiment of the present invention. Accordingly, the voltage level Vx of the sensing signal Sx can be expressed by the following equation (3):

$$Vx = Ix \cdot (R2 \mathbin{/\mkern-5mu/} R3) = 0.8 \cdot \frac{R2}{R1} \cdot \frac{k \cdot \ln(N)}{q} \cdot T, \qquad (3)$$

and the voltage level Vout of the output signal So can be expressed by the following equation (4):

$$Vout = Vx \cdot \frac{R4}{R3}. \qquad (4)$$

Therefore, when the temperature varies during the compared mode, the voltage level Vx is amplified by the gain R4/R3 to generate the output signal So, and the output signal So is then low-passed by the filtering circuit 1064e to generate the second control signal Sc2 for controlling the capacitance of the capacitive circuit 104.

More specifically, in this preferred embodiment 100, when the temperature varies, the oscillating frequency of the output oscillating signal Sosc also varies, then the temperature controlled circuit 106 should vary the capacitance of the capacitive circuit 104 to compensate the variation of the output oscillating signal Sosc. For example, if the oscillating frequency of the output oscillating signal Sosc increases X KHz per Celsius degree (° C.), the sensor gain of the sensing circuit 1062 is YmV/° C., the gain of the operational circuit 1064 is R4/R3, and the varactor gain of the capacitive circuit 104 is Z MHz/V (i.e., Ac=Z MHz/V), then X KHz/° C.=(YmV/° C.)*(R4/R3)*(Z MHz/V). Accordingly, the oscillating frequency of the output oscillating signal Sosc may remains intact over a wide range of temperature change.

It should be noted that, by applying the operational circuit 1064 having the gain of higher than one, i.e., R4/R3>1, the varactor gain Ac of the capacitive circuit 104 can be designed to have a smaller value. In other words, the size of the capacitive circuit 104 can be reduced.

Furthermore, since the voltage level at the control terminal Nc of the capacitive circuit 104 is adjusted to be the predetermined voltage Vr each time the sample mode is performed, the varactor gain Ac of the capacitive circuit 104 always be the optimum varactor gain at the beginning of the compared mode. Therefore, the temperature controlled circuit 106 also possesses the characteristic of high linearity of varactor gain.

In addition, the capacitive circuit 104 in conjunction with the temperature controlled circuit 106 is not limited in using with a phase-locked loop circuit, any other circuits having the requirement of sensing the temperature and adjusting its capacitance accordingly may also embed the capacitive circuit 104 and the temperature controlled circuit 106 therein, in which the circuit comprising the temperature controlled circuit 106 and the capacitive circuit 104 may be regarded as a temperature compensation circuit. Therefore, according to another preferred embodiment of the present invention, the temperature compensation circuit is provided, and the temperature compensation circuit comprises a sensing circuit, an operational circuit, and a capacitive circuit. The sensing circuit is arranged to sense a temperature to generate a sensing signal. The operational circuit is arranged to sample the sensing signal to generate a sample signal during a first phase, and arranged to generate an output signal according to the sensing signal and the sample signal during a second phase. The capacitive circuit is arranged to provide a capacitance adjusted by the output signal. It should be noted that, the operation of the temperature compensation circuit can be referred to the above description related to the temperature controlled circuit 106 and the capacitive circuit 104, thus the detailed description is omitted here for brevity.

Briefly, the present embodiments sample the ambient temperature to periodically generate an updated sample signal for an operational circuit having the gain of higher than one during the sample mode, and set a control voltage of a voltage-controlled capacitive circuit as a predetermined voltage to make the voltage-controlled capacitive circuit have the maximum capacitance gain at the beginning of each compared mode. Then, the operational circuit adjusts the control voltage of the voltage-controlled capacitive circuit according to the ambient temperature to compensate the effects caused by the temperature drifting during the compared mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A temperature compensation circuit, comprising:
   a sensing circuit, arranged to sense a temperature to generate a sensing signal;
   an operational circuit, arranged to sample the sensing signal to generate a sample signal during a first phase, and arranged to generate an output signal according to the sensing signal and the sample signal during a second phase; and
   a capacitive circuit, arranged to provide a capacitance adjusted by the output signal.

2. The temperature compensation circuit of claim 1, wherein the operational circuit provides a gain higher than one upon the sensing signal to generate the output signal during the second phase.

3. The temperature compensation circuit of claim 1, wherein the capacitive circuit comprises:
   a voltage controlled capacitor, having a first terminal coupled to a fixed voltage and a second terminal coupled to the output signal.

4. The temperature compensation circuit of claim 1, wherein the operational circuit comprises:
   an operational amplifier;
   a feedback circuit, coupled between a first input terminal and an output terminal of the operational amplifier, wherein the first input terminal is arranged to receive the sensing signal and the output terminal is arranged to output the output signal;
   a first resistor, coupled between the first input terminal and the sensing circuit; and
   a first capacitor, coupled to a second input terminal of the operational amplifier;
   wherein during the first phase, the first capacitor is arranged to be coupled to the first and second input terminals of the operational amplifier, and the output terminal of the operational amplifier is arranged to couple to a predetermined voltage.

5. The temperature compensation circuit of claim 4, wherein during the second phase, the first capacitor is arranged to be disconnected from the first input terminal of the operational amplifier, and the output terminal of the operational amplifier is arranged to be disconnected from the predetermined voltage.

6. The temperature compensation circuit of claim 4, wherein the predetermined voltage is arranged to make the first capacitor have a maximum capacitance gain.

7. The temperature compensation circuit of claim 4, wherein the feedback circuit comprises:
   a second resistor, coupled between the first input terminal and the output terminal of the operational amplifier, and
   a second capacitor, coupled between the first input terminal and the output terminal of the operational amplifier.

8. The temperature compensation circuit of claim 4, wherein the operational circuit further comprises:
   a filtering circuit, coupled between the output terminal of the operational amplifier and a control terminal of the capacitive circuit, wherein the filtering circuit is arranged to perform a filter operation upon the output signal to generate a filtered output signal at the control terminal for controlling the capacitive circuit during the second phase.

9. The temperature compensation circuit of claim 8, wherein the filtering circuit comprises:
   a second resistor, coupled between the output terminal of the operational amplifier and the control terminal of the capacitive circuit; and
   a second capacitor, coupled to the control terminal;
   wherein the output terminal is arranged to directly couple the control terminal during the first phase.

10. A synthesizer, comprising:
    a phase-locked loop circuit, at least having a controllable oscillator controlled by a first control signal and a second control signal, wherein the first control signal is derived from an output oscillating signal of the synthesizer and a reference oscillating signal;
    a capacitive circuit, arranged to provide a capacitance for the controllable oscillator according to the second control signal; and a temperature controlled circuit, comprising:
   a sensing circuit, arranged to sense a temperature to generate a sensing signal; and
   an operational circuit, arranged to sample the sensing signal to generate a sample signal during a first phase, and arranged to generate the second control signal according to the sensing signal and the sample signal during a second phase.

11. The synthesizer of claim 10, wherein the capacitance is arranged to compensate a frequency drift of the output oscillating signal due to a temperature variation of the synthesizer.

12. The synthesizer of claim 10, wherein the operational circuit provides a gain higher than one upon the sensing signal to generate the second control signal during the second phase.

13. The synthesizer of claim 10, wherein the capacitive circuit comprises:
   a voltage controlled capacitor, having a first terminal coupled to a fixed voltage and a second terminal coupled to the second control signal.

14. The synthesizer of claim 10, wherein the operational circuit comprises:
   an operational amplifier;
   a feedback circuit, coupled between a first input terminal and an output terminal of the operational amplifier, wherein the first input terminal is arranged to receive the sensing signal and the output terminal is coupled to the second control signal;
   a first resistor, coupled between the first input terminal and the sensing circuit; and
   a first capacitor, coupled to a second input terminal of the operational amplifier;
wherein during the first phase, the first capacitor is arranged to be coupled to the first and second input terminals of the operational amplifier, and the output terminal of the operational amplifier is arranged to couple to a predetermined voltage.

15. The synthesizer of claim 14, wherein during the second phase, the first capacitor is arranged be disconnected from the first input terminal of the operational amplifier, and the output terminal of the operational amplifier is arranged to be disconnected from the predetermined voltage.

16. The synthesizer of claim 14, wherein the predetermined voltage is arranged to make the first capacitor have a maximum capacitance gain.

17. The synthesizer of claim 14, wherein the feedback circuit comprises:
   a second resistor, coupled between the first input terminal and the output terminal of the operational amplifier, and
   a second capacitor, coupled between the first input terminal and the output terminal of the operational amplifier.

18. The synthesizer of claim 14, wherein the operational circuit further comprises:
   a filtering circuit, coupled between the output terminal of the operational amplifier and a control terminal of the capacitive circuit, wherein the filtering circuit is arranged to perform a filter operation upon the second control signal to generate a filtered control signal at the control terminal for controlling the capacitive circuit during the second phase.

19. The synthesizer of claim 18, wherein the filtering circuit comprises:
   a second resistor, coupled between the output terminal of the operational amplifier and the control terminal of the capacitive circuit; and
   a second capacitor, coupled to the control terminal;
wherein the output terminal is arranged to directly couple to the control terminal during the first phase.

* * * * *